(12) United States Patent
Shim

(10) Patent No.: US 8,729,576 B2
(45) Date of Patent: May 20, 2014

(54) LIGHT EMITTING DEVICE

(75) Inventor: Heejae Shim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/363,096

(22) Filed: Jan. 31, 2012

(65) Prior Publication Data

US 2012/0138957 A1    Jun. 7, 2012

(51) Int. Cl.
*H01L 33/00* (2010.01)

(52) U.S. Cl.
USPC ............................................................ 257/94

(58) Field of Classification Search
CPC ................................................. H01L 33/12
USPC .................................................. 257/E31.021
See application file for complete search history.

(56) References Cited

U.S. PATENT DOCUMENTS

| | | | | |
|---|---|---|---|---|
| 6,897,139 | B2 * | 5/2005 | Shibata et al. | 438/606 |
| 7,323,764 | B2 * | 1/2008 | Wallis | 257/613 |
| 7,595,544 | B2 * | 9/2009 | Kuroda et al. | 257/627 |
| 2009/0309119 | A1 * | 12/2009 | Shinohara et al. | 257/99 |

OTHER PUBLICATIONS

V. Cimalla, J. Pezoldt, G. Ecke, R. Kosiba, O Ambacher, L. SpieB, G. Teichert, "Growth of cubic InN on r-plane sapphire", Oct. 27, 2003, Applied Physics Letters, vol. 83, No. 17, p. 3468-3470.*

* cited by examiner

*Primary Examiner* — Matthew Reames
*Assistant Examiner* — Nicholas J Choi
(74) *Attorney, Agent, or Firm* — KED & Associates LLP

(57) ABSTRACT

A light emitting device is provided that includes a substrate, a buffer layer disposed on an r-plane of the substrate, the buffer layer having a rock salt structured nitride, and a light emitting structure arranged on the buffer layer, the light emitting structure being grown in an a-plane.

20 Claims, 12 Drawing Sheets

FIG. 7

| Phases | Cell size (Å) |
|---|---|
| LaN | 5.301 |
| ThN | 5.2 |
| PrN | 5.155 |
| NdN | 5.151 |
| SmN | 5.0481 |
| EuN | 5.014 |
| CeN | 5.011 |
| GdN | 4.999 |
| TbN | 4.993 |
| DyN | 4.905 |
| PuN | 4.905 |
| UN | 4.884 |
| YN | 4.877 |
| HoN | 4.874 |
| ErN | 4.839 |
| TmN | 4.809 |
| YbN | 4.7852 |
| LuN | 4.766 |
| NbN (H.T.) | 4.702 |
| ZrN | 4.61 |
| ScN | 4.44 |
| TiN | 4.235 |
| Ti0.9N | 4.231 |
| CrN | 4.14 |
| VN | 4.128 |

701 = Phases column; 702 = Cell size (Å) column

FIG. 8

| 801 | 802 | 803 | 804 | 805 | 806 |
|---|---|---|---|---|---|
| Phases | Cell size (Å) | Lattice mismatch//c axis GaN(%) | Lattice mismatch//m axis GaN(%) | Lattice mismatch//α axis r-Al$_2$O$_3$ (%) | Lattice mismatch//β axis r-Al$_2$O$_3$ (%) |
| LaN | 5.301 | -2.28 | 4.13 | 11.6 | 3.67 |
| ThN | 5.2 | -0.38 | 6.15 | 9.74 | 1.69 |
| PrN | 5.155 | 0.48 | 7.08 | 8.53 | 0.08 |
| NdN | 5.151 | 0.56 | 7.16 | 8.44 | 0.74 |
| SmN | 5.0481 | 2.61 | 9.35 | 6.28 | -1.28 |

LIGHT EMITTING DEVICE

CROSS REFERENCE TO RELATED APPLICATION

This application claims priority under 35 U.S.C. §119 to Korea Application No. 10-2011-0087852 filed in Korea on 31 Aug. 2011 which is hereby incorporated in its entirety by reference as if fully set forth herein.

TECHNICAL FIELD

Embodiments relate to a light emitting device.

BACKGROUND

The light emitting device, such as a light emitting diode of III-V group or II-VI group compound semiconductor or a laser diode, can produce various colors, such as red, blue, and ultra-violet owing to development of the thin film growth technology and device materials therefor, as well as a white color of good efficiency by using a fluorescent material or mixing colors, and is advantageous in that the light emitting device has power consumption lower than the present light sources, such as a fluorescent light and an incandescent light, a semi-permanent lifetime, fast response speed, and safety, and is environment friendly.

Accordingly, application of the light emitting device is expanding even to transmission modules of optical communication means, a light emitting diode back light unit which is replacing the CCFL (Cold Cathode Fluorescence Lamp) back light unit in an LCD (Liquid Crystal Display) device, white light emitting diode lighting devices which are replacing a fluorescent light and an incandescent light, car head lights, and signal lamps.

In the meantime, though the light emitting device may be fabricated to include a nitride semiconductor layer formed on a substrate, a lattice mismatch between the substrate and the nitride semiconductor is liable to cause a lattice defect.

SUMMARY OF THE DISCLOSURE

An embodiment is to provide a light emitting device in which a buffer layer of a rock salt structured nitride is disposed between a light emitting structure and a sapphire substrate of the light emitting device to reduce a lattice mismatch between the light emitting structure and the buffer layer for enhancing stability and reliability of the light emitting device.

In one embodiment, a light emitting device includes a substrate, a buffer layer disposed on an R-plane of the substrate, the buffer layer having a rock salt structured nitride, and a light emitting structure disposed on the buffer layer, the light emitting structure being grown in an a-plane.

For an example, the buffer layer may have a lattice constant in a range of 4.74 Å~5.52 Å, or in a range of 5.11 Å~5.18 Å. And, the buffer layer may be formed of at least one of LaN, ThN, PrN, NdN, or SmN.

And, the light emitting device may further include an undoped semiconductor layer disposed on the buffer layer.

The substrate may be formed of at least one of sapphire $Al_2O_3$, SiC, Si, GaAs, GaN, ZnO, Si, GaP, InP, Ge, or $Ga_2O_3$.

The light emitting structure may include a first conduction type semiconductor layer disposed on the buffer layer, an active layer disposed on the first conduction type semiconductor layer, and a second conduction type semiconductor layer disposed on the active layer.

The light emitting structure may include GaN grown in an a-plane. The buffer layer may have a crystal plane vertically overlapped with the a-plane of the GaN of the light emitting structure. Or, the substrate is a sapphire substrate, and the R-plane of the sapphire substrate, a crystal plane of the buffer layer, and the a-plane of the GaN of the light emitting structure vertically overlap one another.

The buffer layer may include n (Where, n is an integer higher than 2) rock salt structured nitride crystal planes, and the light emitting structure may include n a-plane GaN disposed on the n rock salt structured nitride crystal planes. Each of the n rock salt structured nitride crystal planes of the buffer layer may have a size varied with nitrides. The n may be three.

The substrate may be a sapphire substrate having a crystal cell size of 15.34 Å in an α-axis direction, and 4.75 Å in a β-axis direction, and the crystal cell size of the a-plane GaN is 5.52 Å in an m-axis direction.

In another embodiment, a light emitting device includes a substrate, a buffer layer disposed on an R-plane of the substrate, the buffer layer having a nitride, and a light emitting structure disposed on the buffer layer, the light emitting structure being grown in an a-plane, wherein a lattice mismatch ratio of the buffer layer with the light emitting structure of the a-plane is 3% or under in a c-axis direction, and 10% or under in a m-axis direction, and wherein a lattice mismatch ratio of the buffer layer with the substrate of an r-plane is 12% or under in an α-axis direction and 4% or under in the β-axis direction.

The buffer layer has a lattice constant in a range of 4.74 Å~5.52 Å, or 5.11 Å~5.18 Å. The buffer layer is formed of at least one of LaN, ThN, PrN, NdN, or SmN.

BRIEF DESCRIPTION OF THE DRAWINGS

Arrangements and embodiments may be described in detail with reference to the following drawings in which like reference numerals refer to like elements and wherein:

FIG. 7 illustrates a table showing a size of crystal cell of each of rock salt structured nitrides of a buffer layer in accordance with an embodiment.

FIG. 8 illustrates a table showing a numerical lattice mismatch of each of the rock salt structured nitrides of the buffer layer in accordance with an embodiment.

DETAILED DESCRIPTION

Hereinafter, embodiments will be described with reference to the annexed drawings.

It will be understood that, when an element is referred to as being 'on' or "under" another element, it can be directly on/under the element, and one or more intervening elements may also be present. When an element is referred to as being 'on' or 'under', 'under the element' as well as 'on the element' can be included based on the element.

A thickness or size of an element shown in a drawing may be exaggerated, omitted or shown schematically for convenience or clarity of description. And, the size of the element may not be shown to scale, perfectly.

Figure 1:
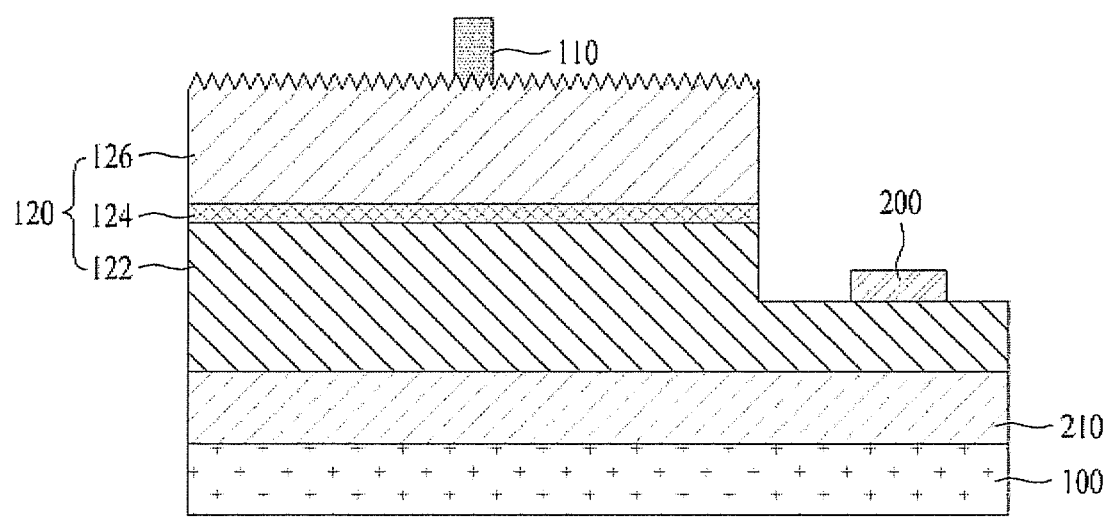
FIG. 1 illustrates a cross-sectional view of a light emitting device in accordance with an embodiment.

FIG. 1 illustrates a cross-sectional view of a light emitting device in accordance with an embodiment.

Referring to FIG. 1, the light emitting device may include a buffer layer 210, a light emitting structure 120, and first and second electrodes 200 and 110. The buffer layer 210 is disposed on a substrate 100, and the light emitting structure 120 is disposed on the buffer layer 210. The light emitting structure 120 includes a first conduction type semiconductor layer 122, an active layer 124, and a second conduction type semiconductor layer 126 disposed on the buffer layer 210.

The first electrode 200 is disposed on the first conduction type semiconductor layer 122, and the second electrode 110 is disposed on the second conduction type semiconductor layer 126.

The material of the substrate 100 can be semiconductor material, metal material, composite material, or the combination thereof. The substrate 100 may be a conductive or insulating substrate of, for an example, at least one of, sapphire $Al_2O_3$, SiC, Si, GaAs, GaN, ZnO, Si, GaP, InP, Ge, or $Ga_2O_3$. As an example, a sapphire $Al_2O_3$ substrate 100 having an r principal plane may be used.

According to the embodiment, the buffer layer 210 may be grown between the light emitting structure 120 and the substrate 100 for moderating a lattice mismatch and a difference of thermal expansion coefficients between the light emitting structure 120 and the substrate 100.

The material of the buffer layer 210 can be semiconductor material, metal material, composite material, or the combination thereof. The buffer layer 210 may be formed of a III to V group compound semiconductor, particularly, a rock salt structured nitride.

Figure 2A:
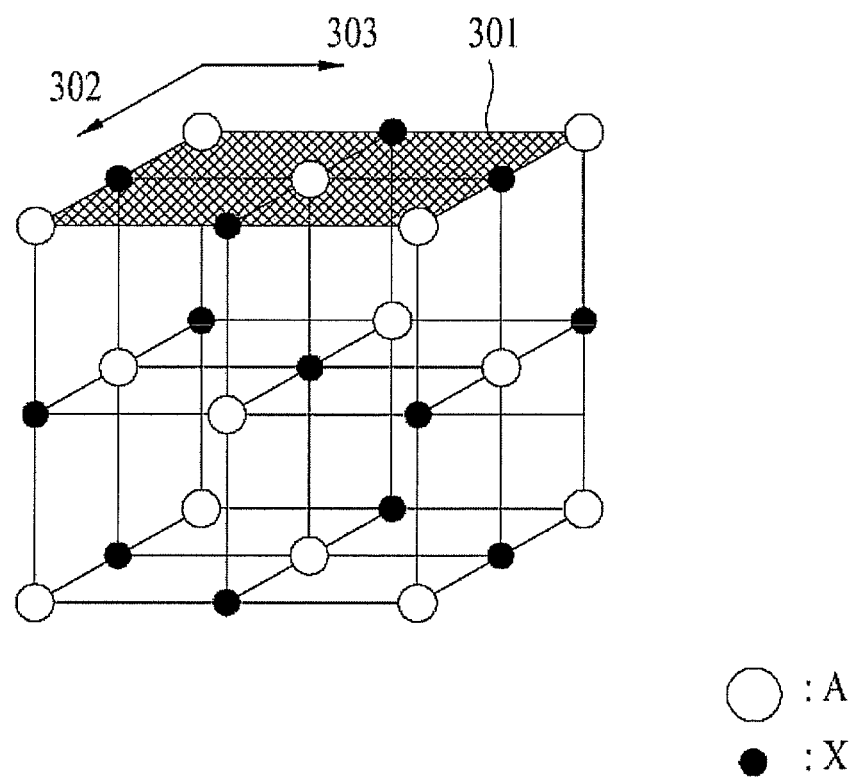
FIGS. 2A and 2B illustrate perspective views of rock salt structures, respectively, in accordance with an embodiment.
Figure 2B:
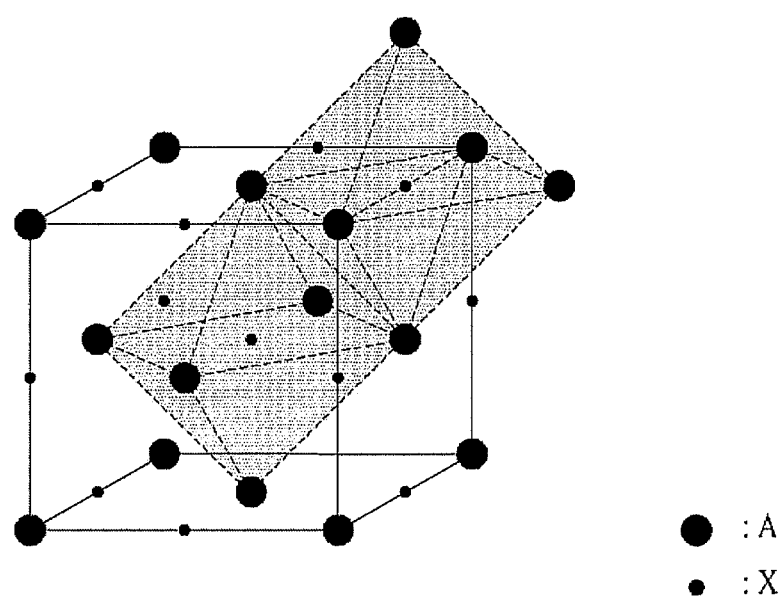

FIGS. 2A and 2B illustrate perspective views of rock salt structures, respectively, in accordance with an embodiment.

A ceramic structure has the same numbers of cations and anions, and a material having such a feature is called as an AX type compound, where the A denotes a cation and X denotes an anion.

The AX compound has various crystal structures, and, as shown in FIG. 2A, a rock salt structure thereof has a structure in which the anions X form an FCC (Face Centered Cubic) structure, and the cations A fill in entire octahedral sites.

And, referring to FIG. 2B, the rock salt structure has a structure in which the octahedron formed of the cations A forms an edge of the octahedron.

In this instance, in the FCC structure of the anions X, a number of the octahedral sites are a number of the anions X. A chemical formula of the rock salt structure is defined as an AX.

In the rock salt structured compounds, there are NaCl, KCl, LiF, MgO, CaO, SrO, NiO, CoO, MnO, PbO, LaN, ThN, PrN, NdN, and SmN. Of the rock salt structured compounds, the buffer layer 210 may be formed of nitride.

For an example, the buffer layer 210 may be formed of at least one of LaN, ThN, PrN, NdN, or SmN.

In this instance, the buffer layer 210 may have a lattice constant in a range of 4.75 Å~5.52 Å.

Particularly, the buffer layer 210 may have a lattice constant in a range of 5.11 Å~5.18 Å.

According to the embodiment, the buffer layer 210 is grown on an R-plane of the sapphire substrate 100, and the light emitting structure 120 may be formed by growing GaN on the buffer layer 210 in an a-plane.

In this instance, a crystalline cell (Or, a crystal plane) of the buffer layer 210 and an a-plane of the GaN of the light emitting structure 120 may overlap, vertically.

An undoped semiconductor layer may be disposed on the buffer layer 210, but not limited to this.

The light emitting structure 120 may be disposed on the buffer layer 210. The light emitting structure 120 may be formed by, but not limited to, for example, MOCVD (Metal Organic Chemical Vapor Deposition), CVD (Chemical Vapor Deposition), PECVD (Plasma-Enhanced Chemical Vapor Deposition), MBE (Molecular Beam Epitaxy), and HVPE (Hydride Vapor Phase Epitaxy). Particularly, the light emitting structure 120 may be GaN grown in the a-plane.

Figure 3:
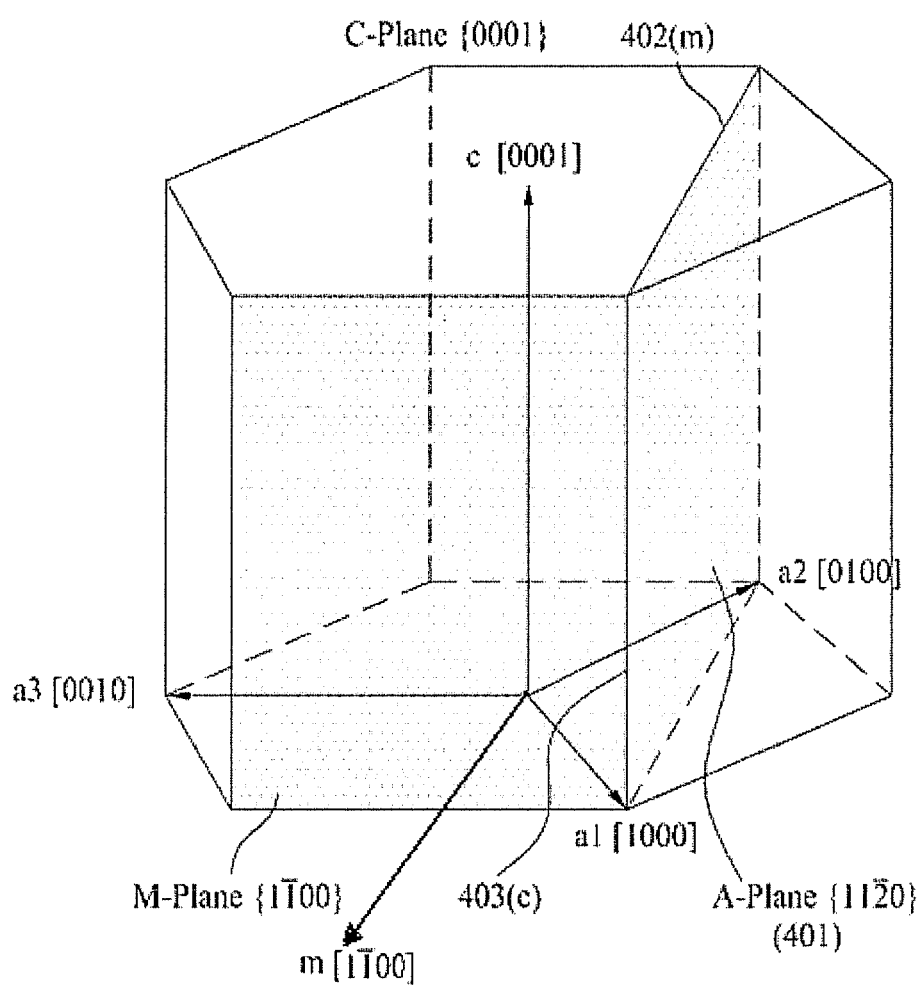
FIG. 3 illustrates a perspective view of a GaN crystal structure.

FIG. 3 illustrates a perspective view of a GaN crystal structure.

Referring to FIG. 3, the GaN crystal structure has nonpolar planes of an m-plane (M-plane) and an a-plane 401 parallel to a c-axis. The a-plane 401 of the GaN may have a side 402($m$) parallel to an m-axis [1-100], and a c side 403($c$) parallel to c-axes [0001].

The light emitting structure 120 of the embodiment may be formed of GaN grown in the a-plane 401 shown in FIG. 3.

The first conduction type semiconductor layer 122 may be disposed on the buffer layer 210 of a semiconductor compound of a III-V and II-VI group compound semiconductor doped with first conduction type dopant. For example, the first conductive type semiconductor layer 122 may be formed of a semiconductor material having composition of $Al_xIn_yGa_{(1-x-y)}N$ ($0 \leq x \leq 1$, $0 \leq y \leq 1$, $0 \leq x+y \leq 1$), at least one selected from GaN, InN, AlN, InGaN, AlGaN, InAlGaN, AlInN, AlGaAs, InGaAs, AlInGaAs, GaP, AlGaP, InGaP, AlInGaP, and InP. If the first conduction type semiconductor layer 122 is an N type semiconductor layer, the first conduction type dopant may include, but not limited to, Si, Ge, Sn, Se, and Te as an N type dopant. The first conduction type semiconductor layer 122 may have, but not limited to, single or multiple layers.

And, the active layer 124 is disposed between the first conduction type semiconductor layer 122 and the second conduction type semiconductor layer 126, for emitting a light having energy fixed by an energy band unique to a material of the active layer (A light emitting layer) as carriers injected thereto through the first conduction type semiconductor layer 122 and the second conduction type semiconductor layer 126 meet.

The active layer 124 may include at least one of a double hetero structure, a multi-hetero structure, a single quantum well structure, a MQW (Multi Quantum Well) structure, a Quantum-Wire structure, or a Quantum dot structure. The active layer 124 may be formed by using □ to V group compound semiconductor and may have a pair structure of well layer/barrier layers constructed of at least any one of, but not limited to, InGaN/GaN, InGaN/InGaN, GaN/AlGaN, InAlGaN/GaN, InAlGaN/InAlGaN, GaAs(InGaAs)/AlGaAs, or GaP(InGaP)/AlGaP. The well layer may be formed of a material having a bandgap narrower than a bandgap of the barrier layer.

The second conduction type semiconductor layer 126 may be formed of a semiconductor compound. The second conductive type semiconductor layer 126 may be embodied of a III to V, and II to VI group compound semiconductor doped with second conduction type dopant. For example, the second conduction type semiconductor layer 126 may be formed of a semiconductor material having composition of $In_xAl_yGa_{1-x-y}N$ ($0 \leq x \leq 1$, $0 \leq y \leq 1$, $0 \leq x+y \leq 1$), or at least one of AlInN, AlGaAs, GaP, GaAs, GaAsP, and AlGaInP. If the second conduction type semiconductor layer 126 is a P type semiconductor layer, the second conduction type dopant may be Mg, Zn, Ca, Sr, and Ba as a P type dopant. The second conduction type semiconductor layer 126 may have, but not limited to, single or multiple layers.

And, the second electrode 110 is disposed on the second conduction type semiconductor layer 126. The second electrode 110 may be formed of, for example, one metal selected from a group including Mo, Cr, Ni, Au, Al, Ti, Pt, V, W, Pd, Cu, Rh and Ir, or an alloy of above metals. The second electrode 110 may be formed on a portion of the second conduction type semiconductor layer 126 with a mask.

And, the first electrode 200 may be disposed on a region of a surface of the first conduction type semiconductor layer 122 mesa etched and exposed. The first electrode 200 may be formed of a material, the same with the second electrode 110.

A method for fabricating the light emitting device shown in FIG. 1 in accordance with an embodiment will be described with reference to FIGS. 4A to 4E.

FIGS. 4A to 4E illustrate sections showing the steps of a method for fabricating a light emitting device in accordance with an embodiment.

Figure 4A:
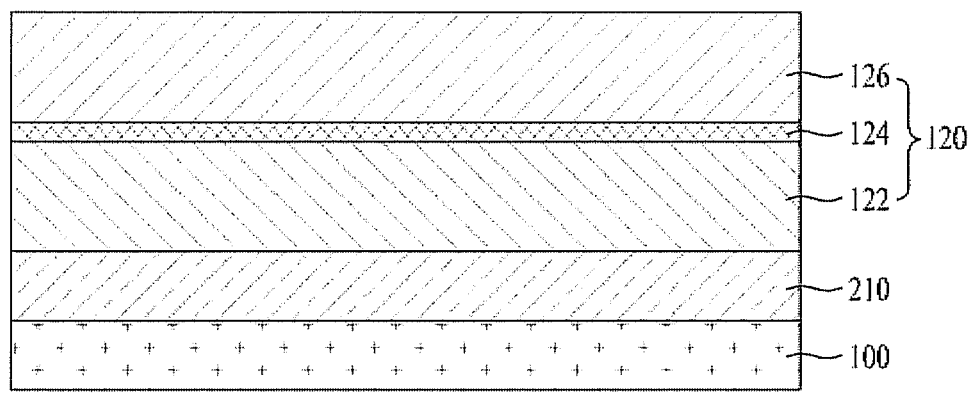
FIGS. 4A to 4E illustrate sections showing the steps of a method for fabricating a light emitting device in accordance with an embodiment.

Referring to FIG. 4A, a substrate 100 is provided. The material of the substrate 100 can be semiconductor material, metal material, composite material, or the combination thereof. The substrate 100 may be a conductive or insulating substrate. The substrate 100 may be formed of, for example, at least one of, sapphire $Al_2O_3$, SiC, Si, GaAs, GaN, ZnO, Si, GaP, InP, Ge, or $Ga_2O_3$.

A roughness structure may be formed on the substrate 100, but not limited to this. The substrate 100 may be subjected to wet washing to remove impurity from a surface thereof. As an example, a sapphire $Al_2O_3$ substrate having an r principle plane may be used as the surface 100.

And, a light emitting structure 120 including the first conductive type semiconductor layer 122, the active layer 124, and the second conductive type semiconductor layer 126 may be disposed on the substrate 100, with a buffer layer 210 disposed therebetween.

Thus, a buffer layer 210 may be grown between the light emitting structure 120 and the substrate 100 for moderating a lattice mismatch and a difference of thermal expansion coefficients between the substrate 100 and the light emitting structure 120.

The material of the buffer layer 210 can be semiconductor material, metal material, composite material, or the combination thereof. The buffer layer may be formed of a □ to V group compound semiconductor, for an example, at least one of GaN, InN, AlN, InGaN, AlGaN, InAlGaN, or AlInN. An undoped semiconductor layer may be disposed on the buffer layer 210, but not limited to this.

Particularly, the buffer layer 210 of the embodiment may be formed of a rock salt structured nitride. For example, the buffer layer 210 may be formed of at least one of LaN, ThN, PrN, NdN, or SmN.

In this instance, the buffer layer 210 may have a lattice constant in a range of 4.75 Å~5.52 Å.

Particularly, the buffer layer 210 may have a lattice constant in a range of 5.11 Å~5.18 Å.

According to the embodiment, the buffer layer 210 is grown on an R-plane of the sapphire substrate 100, and the light emitting structure 120 may be formed by growing GaN on the buffer layer 210 in an a-plane.

In this instance, a crystal cell of the buffer layer 210 and the a-plane of the GaN of the light emitting structure 120 may overlap, vertically.

The light emitting structure 120 may be formed on the buffer layer 210. The light emitting structure 120 may be formed by, but not limited to, for example, MOCVD (Metal Organic Chemical Vapor Deposition), CVD (Chemical Vapor Deposition), PECVD (Plasma-Enhanced Chemical Vapor Deposition), MBE (Molecular Beam Epitaxy), and HVPE (Hydride Vapor Phase Epitaxy). Particularly, the light emitting structure 120 may be GaN grown in the a-plane.

The first conduction type semiconductor layer 122 may be formed by injection of TMGa gas, $NH_3$ gas, $N_2$ gas, silane gas $SiH_4$ including n type impurity such as Si, into a chamber.

The active layer 124 may be formed as at least one of a single quantum well structure, an MQW (Multi Quantum Well) structure, a Quantum-Wire structure, or a Quantum dot structure. For example, the active layer 124 may be formed as the MQW (Multi Quantum Well) structure by injection of, but not limited to, TMGa gas, $NH_3$ gas, $N_2$ gas, and TMIn gas.

The active layer 124 may have a pair structure of well layer/barrier layers constructed of at least any one of, but not limited to, InGaN/GaN, InGaN/InGaN, GaN/AlGaN, InAlGaN/GaN, GaAs(InGaAs)/AlGaAs, or GaP(InGaP)/AlGaP. The well layer may be formed of a material having a bandgap narrower than a bandgap of the barrier layer.

There may be a conductive clad layer (Not shown) disposed on or/and underside of the active layer 124. The conductive clad layer may be formed of an AlGaN group semiconductor to have an energy bandgap wider than the energy bandgap of the active layer 124.

The second conductive type semiconductor layer 126 may be formed of a III to V group compound semiconductor doped with second conduction type dopant, for example, a semiconductor having composition of $In_xAl_yGa_{1-x-y}N$ ($0 \leq x \leq 1$, $0 \leq y \leq 1$, $0 \leq x+y \leq 1$). If the second conductive type semiconductor layer 126 is a P type semiconductor layer, the second conduction type dopant may include Mg, Zn, Ca, Sr, Ba, etc. as a P type dopant.

As the second conductive type semiconductor layer 126, though a p type GaN layer may be formed by injecting, but not limited to, TMGa gas, NH3 gas, N2 gas, and bis-ethyl cycro pentadienyl magnesium (EtCp2Mg) $\{Mg(C_2H_5C_5H_4)_2\}$ including p type impurity such as Mg, into a chamber.

In the embodiment, the first conductive type semiconductor layer 122 may be embodied as a P type semiconductor layer, and the second conductive type semiconductor layer 126 may be embodied as an N type semiconductor layer. And, on the second conductive type semiconductor layer 126, a semiconductor layer having a polarity opposite to the second conductive type, for example, an N type semiconductor layer (Not shown) may be disposed if the second conductive type semiconductor layer 126 is the P type semiconductor layer. According to this, the light emitting structure 120 may be embodied as one of an N-P junction structure, a P-N junction structure, an N-P-N junction structure, and a P-N-P junction structure.

Figure 4B:
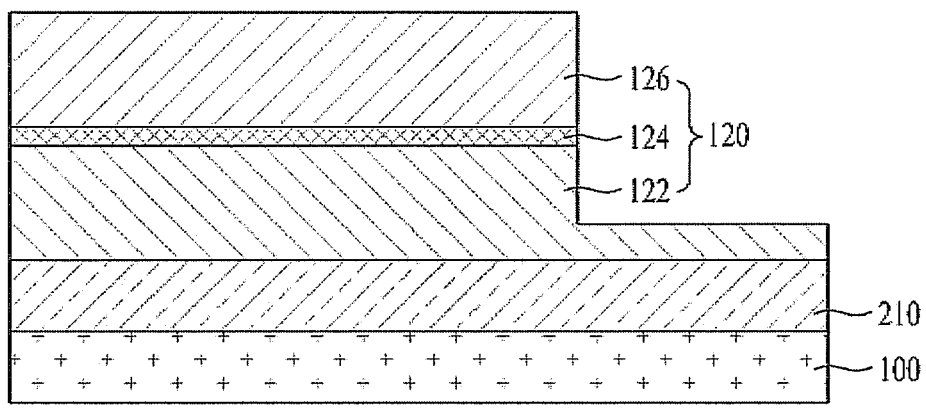

Then, referring to FIG. 4B, a mesa etching is performed starting from the second conduction type semiconductor layer 126 to a portion of the first conduction type semiconductor layer 122 by RIE (Reactive Ion Etching) to expose the first conduction type semiconductor layer 122.

For example, if an insulating substrate, such as the sapphire substrate, is used, an electrode is unable to be formed on an underside of the substrate. Thus, the mesa etching is performed starting from the second conduction type semiconductor layer 126 to a portion of the first conduction type semiconductor layer 122, enabling to secure a space for forming the electrode therein.

Figure 4C:
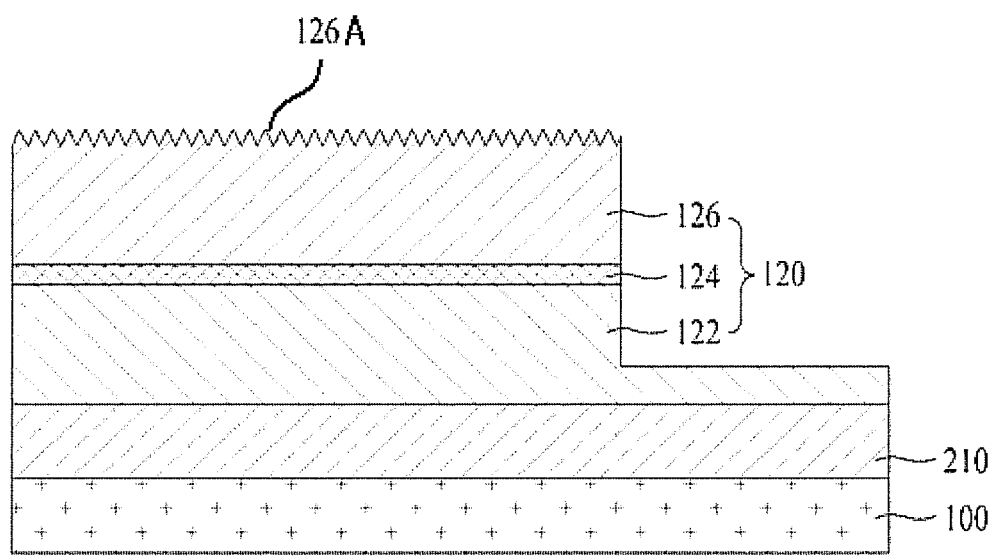

Then, referring to FIG. 4C, a roughness structure 126A is formed on the second conduction type semiconductor layer 126. In this instance, the roughness structure may be formed by PEC (Photo Electro Chemical), or etching with a mask.

In the PEC, by adjusting an amount of an etching solution (e.g. KOH) and a difference of etch rates come from GaN crystallinity, a micron sized roughness shape may be adjusted. The roughness structure may be disposed to be periodic or non-periodic.

Depending on embodiments, an ohmic layer (Not shown) may be disposed on the second conduction type semiconductor layer 126 for electric contact to the second electrode 110, but this is not limited. The ohmic layer may be formed of ITO (Indium Tin Oxide). The ohmic layer may be formed of, for example, at least one of In, Co, Si, Ge, Au, Pd, Pt, Ru, Re, Mg, Zn, Hf, Ta, Rh, Ir, W, Ti, Ag, Cr, Mo, Nb, Al, Ni, Cu, WTi, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Al, Rh, Pd, Ir, Ru, Mg, Zn, Pt, Au, or Hf.

The roughness structure 126A shown in FIG. 4C may not be formed, but not limited to this.

Figure 4D:
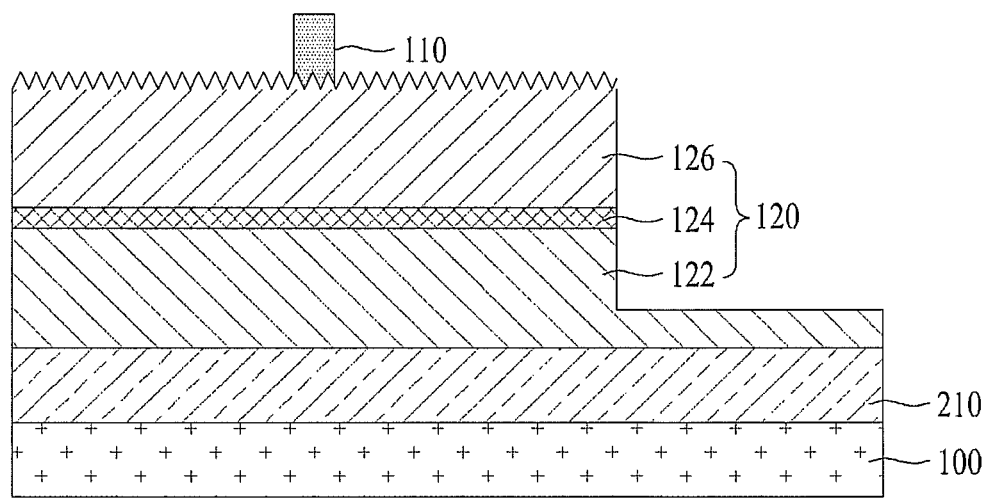

And, referring to FIG. 4D, a second electrode 110 may be disposed on a surface of the second conduction type semiconductor layer 126. The second electrode 110 may be formed of, for example, one metal selected from a group including Mo, Cr, Ni, Au, Al, Ti, Pt, V, W, Pd, Cu, Rh and Ir, or an alloy of above metals. The second electrode 110 may be formed on a portion of the second conduction type semiconductor layer 126 with a mask.

Figure 4E:
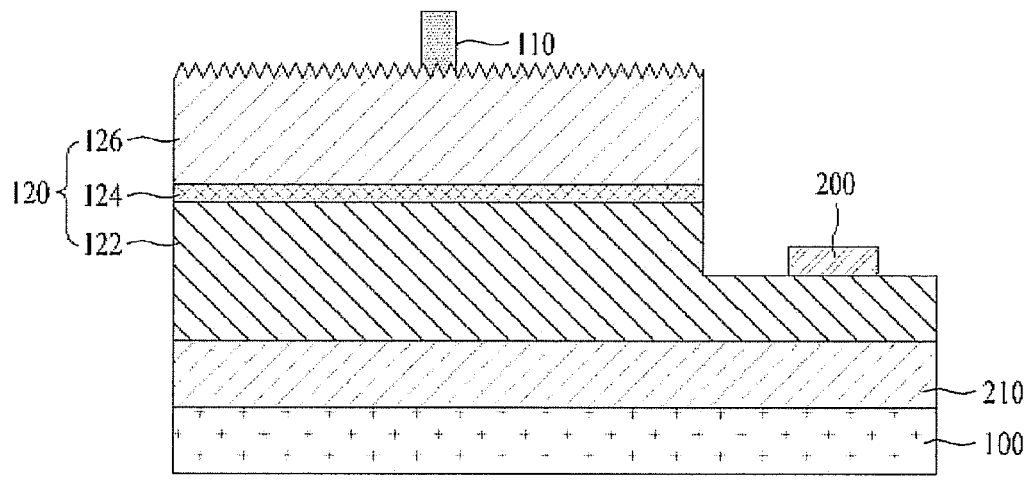

And, referring to FIG. 4E, the first electrode 200 may be disposed on a region of an etched and exposed surface of the first conduction type semiconductor layer 122. The first electrode 200 may be formed of a material the same with the second electrode 110.

Figure 5:
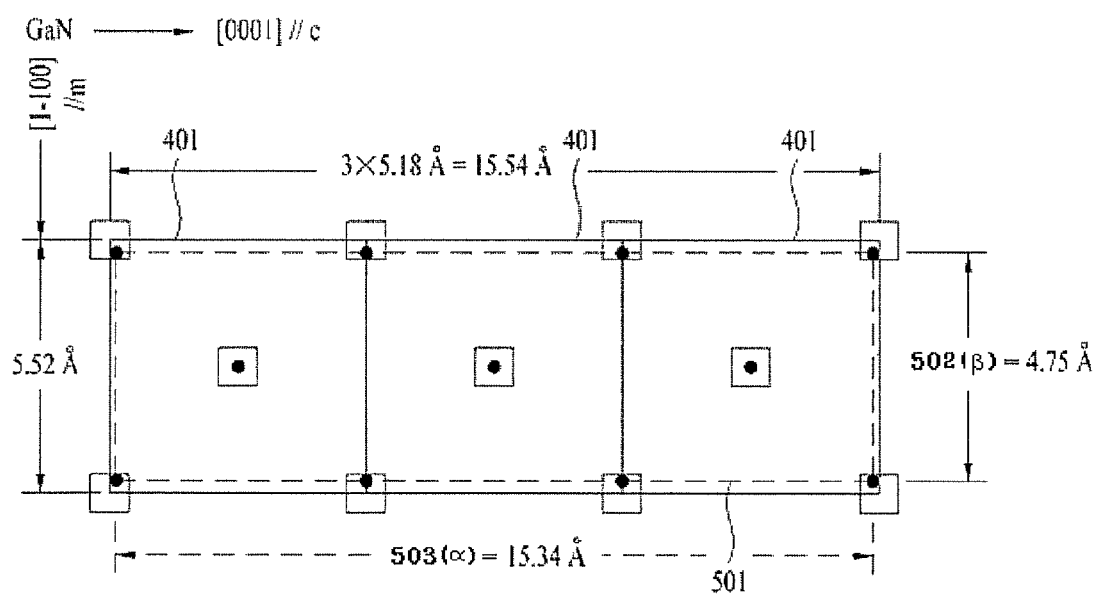
FIG. 5 illustrates a schematic view showing an example in which an a-plane GaN is formed on an R-plane sapphire substrate.

FIG. 5 illustrates a schematic view showing an example in which the a-plane GaN is formed on the r-plane sapphire substrate.

If the a-plane GaN 401 is formed on the sapphire $Al_2O_3$ substrate 501 having the r principle plane without the buffer layer 210, three a-plane GaN 401 may be formed on one sapphire $Al_2O_3$ substrate 501 having the r principle plane.

The r-plane of the sapphire substrate 501 has a width side 503($\alpha$) parallel to an $\alpha$-axis, and a height side 502($\beta$) parallel to a $\beta$-axis. In this instance, the width side is longer than the height side.

In this instance, the r-plane sapphire $Al_2O_3$ substrate 501 has a crystal cell size of 15.34 Å in the $\alpha$-axis direction, and 4.75 Å in the $\beta$ direction, and the three a-plane GaN 401 have crystal cell sizes of 5.52 Å in the m-axis direction, and 15.54 Å in the c-axis direction, causing 1.3% of lattice mismatch in the c-axis direction, and 16.2% of lattice mismatch in the m-axis direction.

Because the r-plane sapphire $Al_2O_3$ substrate 501 has a crystal cell size of 4.75 Å in the $\beta$-axis direction, and the a-plane GaN 401 has a length of 5.52 Å in the m-axis direction, the buffer layer 210 may have a lattice constant in a range of 4.75 Å~5.52 Å.

Particularly, because the a-plane GaN 401 has a length of 5.18 Å in the c-axis direction, and the r-plane sapphire $Al_2O_3$ substrate 501 has a crystal cell size of 15.34 Å (15.34 Å/3=5.11 Å) in the $\alpha$-axis direction, the buffer layer 210 may have a lattice constant in a range of 5.11 Å~5.18 Å.

Figure 6:
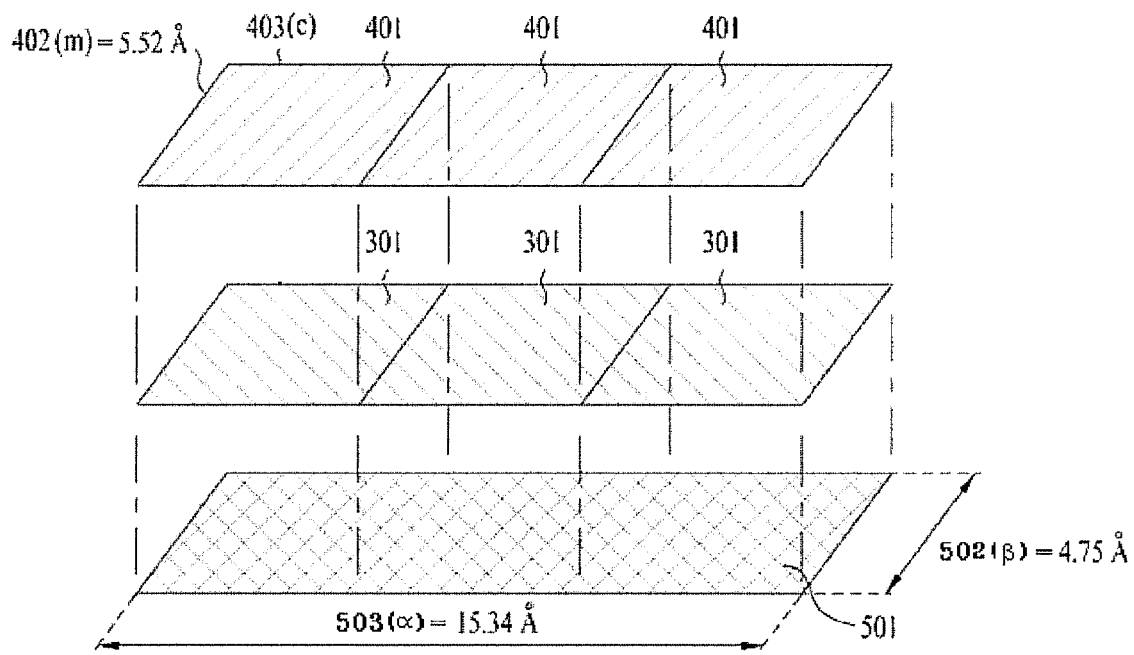
FIG. 6 illustrates a perspective view showing a rock salt structured buffer layer formed between a light emitting structure having an a-plane GaN formed on an R-plane sapphire substrate in accordance with an embodiment.

FIG. 6 illustrates a perspective view showing a rock salt structured buffer layer disposed between an r-plane sapphire substrate 501 and a light emitting structure 401 of an a-plane GaN in accordance with an embodiment.

Referring to FIG. 6, the rock salt structured buffer layer is disposed between the r-plane sapphire substrate 501 and the light emitting structure 401 of the a-plane GaN.

In this instance, n (Where, n is 2 or integer higher than 2) rock salt structured nitride crystal cells 301 for the buffer layer may be disposed on the r principle plane sapphire $Al_2O_3$ substrate 501 vertically, and n a-plane GaN 401 may be formed on the n nitride crystal cells 301. For example, the n may be 3 as shown in FIG. 6.

In this instance, the crystal cell of the r-plane sapphire $Al_2O_3$ substrate 501 may have a size of 15.34 Å in an $\alpha$-axis direction, and 4.75 Å in a $\beta$-axis direction, and the a-plane GaN 401 may have a length of 5.52 Å in an m-axis direction.

Each of the three rock salt structured nitride crystal cells 301 which construct the buffer layer may have a size (Or, a lattice constant) varied with the nitrides.

FIG. 7 illustrates a table showing a size of crystal cell of each of rock salt structured nitrides of a buffer layer 210 in accordance with an embodiment.

Referring to FIG. 7, the size of the crystal cell of each of the rock salt structured nitrides 701 of the buffer layer 210 may be as shown in reference numerals 702, respectively.

FIG. 8 illustrates a table showing a numerical lattice mismatch of each of the rock salt structured nitrides of the buffer layer 210 in accordance with an embodiment.

Referring to FIG. 8, the size of the crystal cell of each of the rock salt structured nitrides 801 of the buffer layer 210 may be as shown in reference numerals 802. In this instance, the size of the crystal cell may be a width or a height and the width may be the same as the height.

The reference numerals 803 and 804 denote the lattice mismatch ratio of the buffer layer 210 with the light emitting structure 120 of the a-plane GaN 401 when each of the nitrides constructs the buffer layer 210.

For example, referring to FIG. 8, in a case of the buffer layer 210 of LaN, the lattice mismatch ratio of the buffer layer 210 with the light emitting structure 120 of the a-plane GaN is −2.28% in the c-axis direction, and 4.13% in the m-axis direction.

And, in the case of the buffer layer 210 of LaN, the lattice mismatch ratio of the buffer layer 210 with the r-plane sapphire $Al_2O_3$ substrate 100 is 11.6% in the $\alpha$-axis direction and 3.67% in the $\beta$-axis direction.

And, in a case of the buffer layer 210 of ThN, the lattice mismatch ratio of the buffer layer 210 with the light emitting structure 120 of the a-plane GaN is −0.38% in the c-axis direction, and 6.15% in the m-axis direction.

And, in the case of the buffer layer 210 of PhN, the lattice mismatch ratio of the buffer layer 210 with the r-plane sapphire $Al_2O_3$ substrate 100 is 9.74% in the $\alpha$-axis direction and 1.69% in the $\beta$-axis direction.

And, in a case of the buffer layer 210 of PrN, the lattice mismatch ratio of the buffer layer 210 with the light emitting structure 120 of the a-plane GaN is 0.48% in the c-axis direction and 7.08% in the m-axis direction.

And, in the case of the buffer layer 210 of PrN, the lattice mismatch ratio of the buffer layer 210 with the r-plane sapphire $Al_2O_3$ substrate 100 is 8.53% in the α-axis direction and 0.08% in the β-axis direction.

And, in a case of the buffer layer 210 of NdN, the lattice mismatch ratio of the buffer layer 210 with the light emitting structure 120 of the a-plane GaN is 0.56% in the c-axis direction and 7.16% in the m-axis direction.

And, in the case of the buffer layer 210 of NdN, the lattice mismatch ratio of the buffer layer 210 with the r-plane sapphire $Al_2O_3$ substrate 100 is 8.44% in the α-axis direction and 0.74% in the β-axis direction.

And, in a case of the buffer layer 210 of SmN, the lattice mismatch ratio of the buffer layer 210 with the light emitting structure 120 of the a-plane GaN is 2.61% in the c-axis direction and 9.35% in the m-axis direction.

And, in the case of the buffer layer 210 of SmN, the lattice mismatch ratio of the buffer layer 210 with the r-plane sapphire $Al_2O_3$ substrate 100 is 6.28% in the α-axis direction and −1.28% in the β-axis direction.

In this instance, in a case the lattice mismatch ratio is a minus, the a-plane GaN may have a tensile stress. And, in a case the lattice mismatch ratio is a plus, the a-plane GaN may have a compressive stress.

Alike the embodiment, referring to FIG. 5, the nitride buffer layer 210 disposed between the r-plane sapphire substrate 100, or 501 and the a-plane light emitting structure 120 shows a lattice mismatch ratio lower than a case when the buffer layer 210 is not disposed therebetween. Eventually, the embodiment has an advantage in that stability and reliability of the light emitting device can be enhanced by moderating the lattice mismatch and the difference of thermal expansion coefficients with the buffer layer 210 between the substrate 100 and the light emitting structure 120.

For example, if no buffer layer 210 is disposed, a lattice mismatch ratio of 1.3% takes place in the c-axis direction of the a-plane GaN, and a lattice mismatch ratio of 16.2% takes place in the m-axis direction of the a-plane GaN. Opposite to this, if the buffer layer 210 is disposed, since the lattice mismatch ratio of the buffer layer 210 with the light emitting structure 120 of the a-plane GaN becomes −2.28% in the c-axis direction, and 4.13% in the m-axis direction, the lattice mismatch is reduced to enhance the stability and the reliability of the light emitting device.

Figure 9:
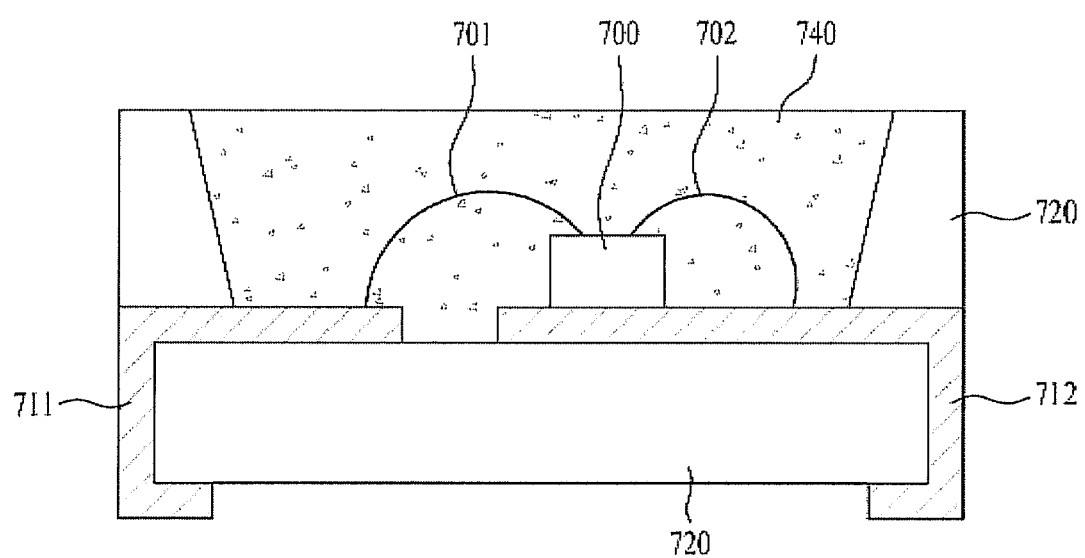
FIG. 9 illustrates a cross-sectional view of a light emitting device package in accordance with an embodiment.

FIG. 9 illustrates a cross-sectional view of a light emitting device package in accordance with an embodiment.

Referring to FIG. 9, the light emitting device package includes a package body 720, a first electrode layer 711 and a second electrode layer 712, a light emitting device 700, and a molded portion 740. The light emitting device 700 is mounted on the package body 720 and connected to both the first electrode layer 711 and the second electrode layer 712, and corresponds to the light emitting device shown in FIG. 1.

Referring to FIG. 9, the first electrode layer 711 and the second electrode layer 712 are mounted on the package body 720, and the molded portion encompasses the light emitting device 700.

The package body 720 may be formed of silicon, synthetic resin, or metal, and enhance light extraction efficiency as package body 720 has a sloped surface formed near the light emitting device 700.

The first electrode layer 711 and the second electrode layer 712 are isolated from each other electrically, and provide power to the light emitting device 700. And, the first electrode layer 711 and the second electrode layer 712 may increase optical efficiency by reflecting the light emitted from the light emitting device 700, and may also dissipate heat generated from the light emitting device 700 to an outside of the light emitting device package.

The light emitting device 700 may be mounted on the package body 720, or on the first electrode layer 711, or the second electrode layer 712.

The light emitting device 700 may be connected to the first electrode layer 711 and the second electrode layer 712 by a wire bonding type, flip chip type, or die bonding type, electrically.

The light emitting device package may have at least one or a plurality of, but not limited to, the light emitting device disclosed in any one of the above embodiments.

An array of the light emitting device packages of the embodiment may be on a substrate, and a light guide plate, a prism sheet, a diffusion sheet, and the like that are optical members may be disposed on a light path of the light emitting device package. The light emitting device package, the substrate, and the optical members may function as a lighting unit. As another embodiment, a display device, an indicating device, or a lighting system can be produced, which includes the semiconductor light emitting device or the light emitting device package described in the foregoing embodiments, and the lighting system can include, for example, a lamp or a street light.

Figure 10:
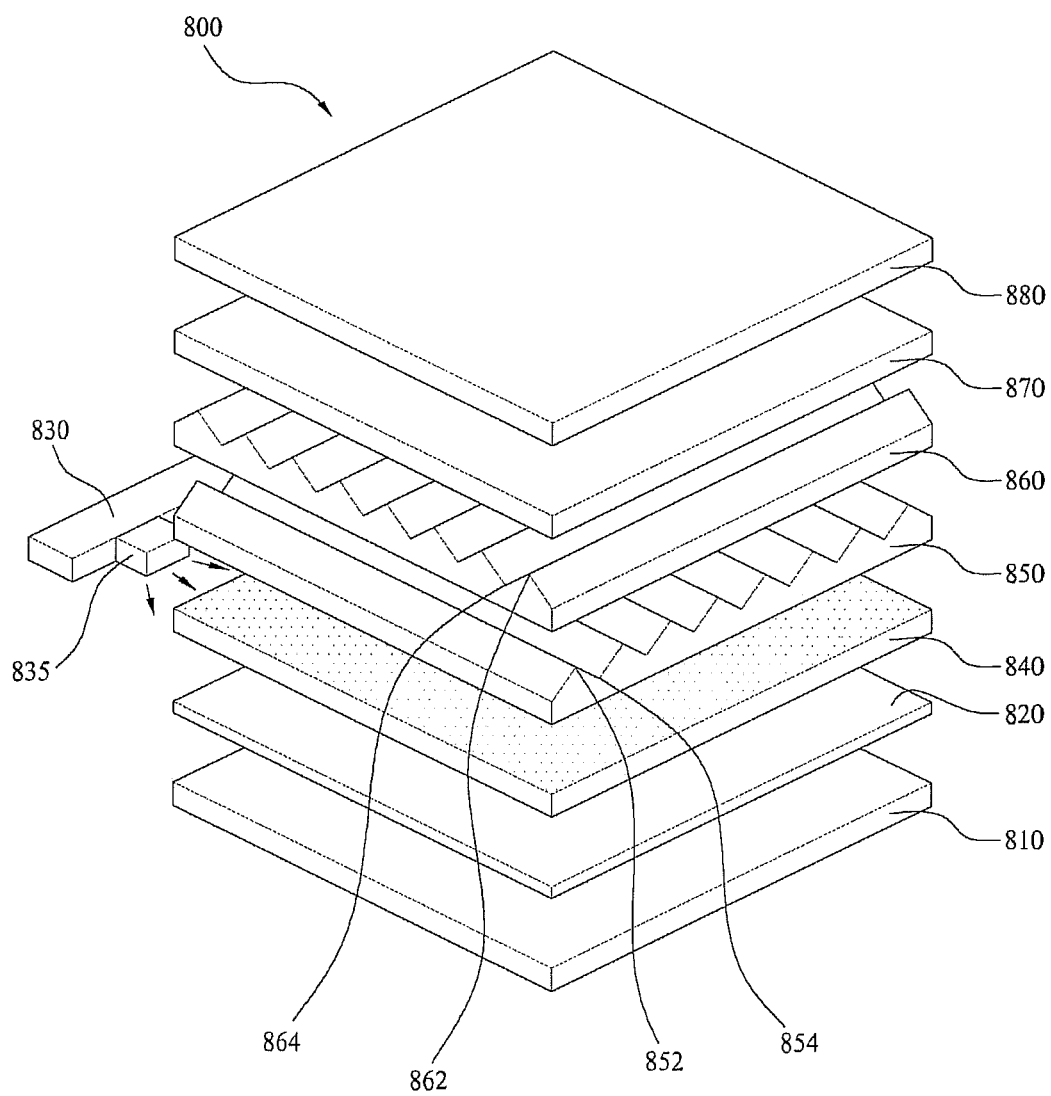
FIG. 10 illustrates a perspective view of a display device having a light emitting device in accordance with one of the embodiments applied thereto.

FIG. 10 illustrates an exploded perspective view of a display device having a light emitting device in accordance with one of the embodiments applied thereto.

Referring to FIG. 10, the display device 800 includes a light source module 830 and 835, a reflective plate 820 on a bottom cover 810, a light guide plate 840, a first prism sheet 850, a second prism sheet 860, a panel 870, and a color filter 880. The light guide plate 840 is disposed in front of the reflective plate 820 for guiding the light emitted from the light source module to a front of the display device. The first prism sheet 850 and the second prism sheet 860 are disposed in front of the light guide plate 840. The panel 870 is disposed in front of the second prism sheet 860, and the color filter 880 is disposed throughout the panel 870.

The light source module includes a light emitting device package 835 on a substrate 830. The bottom cover 810 may accommodate elements of the display device 800. And, the reflective plate 820 can be an individual element as shown in the drawing, or can be a coat of a material with a high reflectivity on a rear of the light guide plate 840 or on a front of the bottom cover 810.

In this instance, the reflective plate 820 may be formed of a material which has high reflectivity and can be used as a thin film, such as PET (PolyEthylene Terephtalate).

The light guide plate 840 diffuses the light emitted from the light emitting device package module for uniform distribution of the light to an entire region of a screen of the liquid crystal display panel. Accordingly, the light guide plate 840 is formed of a material having good refractivity and transmissivity, such as PolyMethylMethAcrylate PMMA, PolyCarbonate PC, or PolyEthylene PE.

And, the light guide plate 840 may be omitted so as to be configured as an air guide type in which the light is transmitted through a space between the reflective plate 820 and the first prism sheet 850.

And, the first prism sheet 850 may be formed of a polymer having light transmissivity and elasticity on one side of a supporting film. The polymer may have a prism layer with a plurality of three dimensional structures formed thereon, repeatedly. In this instance, as shown, the plurality of patterns may be a stripe type with repetitive ridges and grooves.

And, a direction of the ridges 862 and the grooves 864 in the second prism sheet 860 may be perpendicular to a direction of the ridges 852 and the grooves 854 in the first prism sheet 850, for uniform distribution of the light transmitted from the light source module and the reflective sheet to an entire surface of the panel 870.

Though not shown, each of the prism sheets may have a protective sheet provided thereon. A protective layer having light diffusing particles and a binder may be provided on both sides of the supporting film.

And, the prism layer may be formed of a polymer material selected from a group having polyurethane, styrene butadiene copolymer, polyacrylate, polymethacrylate, polymethylmethacrylate, polyethyleneterephthalate elastomer, polyisoprene, and polysilicone.

Though not shown, a diffusion sheet may be disposed between the light guide plate 840 and the first prism sheet 850. The diffusion sheet may be formed of a material selected from a polyester group and a polycarbonate group, for widening a light projection angle to the maximum by refraction and scattering of the light from the backlight unit.

The diffusion sheet may include a supporting layer having light diffuser contained therein, and a first layer and a second layer both without the light diffuser contained therein formed on a light forwarding surface (a first prism sheet direction) and a light incident surface (a reflective sheet direction), respectively.

The supporting layer may consist of 100 parts by weight of a mixed resin of Methacrylate-styrene copolymer and Methacrylate methyl-styrene copolymer, added with 0.1~10 parts by weight of siloxane group optical diffuser having an average particle diameter of 1~10 μm, and 0.1~10 parts by weight of acryl group optical diffuser having an average particle diameter of 1~10 μm.

The first layer and the second, layer may consist of 100 parts by weight of a resin of Methacrylate methyl-styrene copolymer, added with 0.01~1 parts by weight of UV ray absorbent, and 0.001~10 parts by weight of antistatic agent.

In the diffusion sheet, the supporting layer may have a thickness of 100~10000 μm, and each of the layers may have a thickness of 10~1000 μm.

In the embodiment, the diffusion sheet, the first prism sheet 850 and the second prism sheet 860 construe the optical sheet. The optical sheet may be constructed of other combination, for example, a microlens array, a combination of the diffusion sheet and the microlens array, a combination of one prism sheet and the microlens array, or so on.

As the panel 870, a liquid crystal panel may be applied, and besides the liquid crystal panel 860, other kinds of display devices each of which requires a light source may be applied.

The panel 870 has liquid crystals disposed between glass panels, and polarizing plates placed on both of the glass panels for utilizing polarizability of a light. The liquid crystals have intermediate characteristics of liquid and solid, in which the liquid crystals, organic molecules with fluidity like the liquid, are arranged regularly like crystal. By utilizing a characteristic of the liquid crystals in which a molecular arrangement varies with an external electric field, a picture is displayed.

The liquid crystal panel used in the display device has an active matrix system, in which transistors are used as a switch for controlling a voltage supplied to pixels.

A color filter 880 is provided on a front of panel 870 to transmit only red, green and blue lights of the light penetrating the panel 870, thereby displaying a picture.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a substrate;
    a buffer layer disposed on an r-plane of the substrate, the buffer layer having a rock salt structured nitride; and
    a light emitting structure disposed on the buffer layer, a primary surface of the light emitting structure being an a-plane.

2. The light emitting device as claimed in claim 1, wherein the buffer layer has a lattice constant in a range of 4.74 Å~5.52 Å.

3. The light emitting device as claimed in claim 1, wherein the buffer layer has a lattice constant in a range of 5.11 Å~5.18 Å.

4. The light emitting device as claimed in claim 1, wherein the buffer layer is formed of at least one of LaN, ThN, PrN, NdN, or SmN.

5. The light emitting device as claimed in claim 1, further comprising an undoped semiconductor layer disposed on the buffer layer.

6. The light emitting device as claimed in claim 1, wherein the substrate is formed of at least one of sapphire Al2O3, SiC, Si, GaAs, GaN, ZnO, Si, GaP, InP, Ge, or Ga2O3.

7. The light emitting device as claimed in claim 1, wherein the light emitting structure includes:
    a first conduction type semiconductor layer disposed on the buffer layer,
    an active layer disposed on the first conduction type semiconductor layer, and
    a second conduction type semiconductor layer disposed on the active layer.

8. The light emitting device as claimed in claim 1, wherein the light emitting structure includes GaN grown in the a-plane.

9. The light emitting device as claimed in claim 8, wherein the buffer layer has a crystal plane vertically overlapped with the a-plane of the GaN of the light emitting structure.

10. The light emitting device as claimed in claim 8, wherein the substrate is a sapphire substrate, and wherein the r-plane of the sapphire substrate, a crystal plane of the buffer layer, and the a-plane of the GaN of the light emitting structure vertically overlap one another.

11. The light emitting device as claimed in claim 8, wherein the buffer layer includes n (Where, n is 2 or an integer greater than 2) rock salt structured nitride crystal planes, and wherein the light emitting structure includes n a-plane GaN disposed on the n rock salt structured nitride crystal planes.

12. The light emitting device as claimed in claim 11, wherein each of the n rock salt structured nitride crystal planes of the buffer layer has a size varied with nitrides.

13. The light emitting device as claimed in claim 11, wherein the n is three.

14. The light emitting device as claimed in claim 13, wherein the substrate is a sapphire substrate having a crystal cell size of 15.34 Å in an α-axis direction.

15. The light emitting device as claimed in claim 14, wherein the crystal cell size of the sapphire substrate is 4.75 Å in a β-axis direction.

16. The light emitting device as claimed in claim 15, wherein the crystal cell size of the a-plane GaN is 5.52 Å in an m-axis direction.

17. A light emitting device, comprising:
   a substrate;
   a buffer layer disposed on an r-plane of the substrate, the buffer layer having a nitride; and
   a light emitting structure disposed on the buffer layer, a primary surface of the light emitting structure being an a-plane, wherein a lattice mismatch ratio of the buffer layer with the light emitting structure of the a-plane is 3% or under in a c-axis direction, and 10% or under in an m-axis direction, and wherein a lattice mismatch ratio of the buffer layer with the substrate of an r-plane is 12% or under in an α-axis direction and 4% or under in a β-axis direction.

18. The light emitting device as claimed in claim 17, wherein the buffer layer has a lattice constant in a range of 4.74 Å~5.52 Å.

19. The light emitting device as claimed in claim 17, wherein the buffer layer has a lattice constant in a range of 5.11 Å~5.18 Å.

20. The light emitting device as claimed in claim 17, wherein the buffer layer is formed of at least one of LaN, ThN, PrN, NdN, or SmN.

* * * * *

UNITED STATES PATENT AND TRADEMARK OFFICE
CERTIFICATE OF CORRECTION

PATENT NO.        : 8,729,576 B2
APPLICATION NO.   : 13/363096
DATED             : May 20, 2014
INVENTOR(S)       : Heejae Shim Page 1 of 1

It is certified that error appears in the above-identified patent and that said Letters Patent is hereby corrected as shown below:

TITLE PAGE: ITEM 30 insert

--Foreign Priority Application Data

| Application Number | Filing Date |
| --- | --- |
| KR 10-2011-0087852 | August 31, 2011-- |

Signed and Sealed this
Second Day of December, 2014

Michelle K. Lee
*Deputy Director of the United States Patent and Trademark Office*